US011355315B2

(12) United States Patent
Ikeda et al.

(10) Patent No.: US 11,355,315 B2
(45) Date of Patent: Jun. 7, 2022

(54) PLASMA PROCESSING APPARATUS AND PLASMA PROCESSING METHOD

(71) Applicant: HITACHI HIGH-TECH CORPORATION, Tokyo (JP)

(72) Inventors: Norihiko Ikeda, Tokyo (JP); Naoki Yasui, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 15/445,027

(22) Filed: Feb. 28, 2017

(65) Prior Publication Data
US 2018/0082821 A1 Mar. 22, 2018

(30) Foreign Application Priority Data

Sep. 16, 2016 (JP) .............................. JP2016-181131

(51) Int. Cl.
H01J 37/32 (2006.01)
(52) U.S. Cl.
CPC ... *H01J 37/32146* (2013.01); *H01J 37/32119* (2013.01); *H01J 37/32183* (2013.01); *H01J 37/32669* (2013.01); *H01J 2237/3341* (2013.01)
(58) Field of Classification Search
CPC ......... H01J 2237/3341; H01J 37/32119; H01J 37/32146; H01J 37/32174;
(Continued)

(56) References Cited

U.S. PATENT DOCUMENTS 8,568,606 B2 * 10/2013 Ohse ................. H01J 37/32091
216/37
2008/0053818 A1 * 3/2008 Ui ..................... H01J 37/32091
204/164
(Continued)

FOREIGN PATENT DOCUMENTS

JP H06338476 A 12/1994
JP 2008-060429 A 3/2008
(Continued)

OTHER PUBLICATIONS

Office Action dated Dec. 12, 2017 for related Korean Application No. 10-2017-0000145.
(Continued)

Primary Examiner — Benjamin Kendall
(74) Attorney, Agent, or Firm — Miles & Stockbridge, P.C.

(57) ABSTRACT

A plasma processing apparatus according to the present invention includes a processing chamber, a first radio frequency power source, and a second radio frequency power source. The first radio frequency power source supplies radio frequency power to generate the plasma. The second radio frequency power source applies a first radio frequency voltage to a sample stage. The plasma processing apparatus further includes a third radio frequency power source and a controller. The third radio frequency power source applies, to the sample stage, a second radio frequency voltage having a frequency which is N times a frequency of the first radio frequency voltage in a case where N is a natural number of 2 or more. The controller controls a phase difference such that the phase difference between a phase of the first radio frequency voltage and a phase of the second radio frequency voltage reaches a predetermined value.

4 Claims, 17 Drawing Sheets

(58) Field of Classification Search
CPC ........... H01J 37/32183; H01J 37/32192; H01J 37/32311; H01J 37/32669
See application file for complete search history.

(56) References Cited

U.S. PATENT DOCUMENTS

| | | | | |
|---|---|---|---|---|
| 2008/0190893 | A1* | 8/2008 | Mori | C23F 4/00 216/61 |
| 2009/0297404 | A1* | 12/2009 | Shannon | H01J 37/32082 422/108 |
| 2010/0258529 | A1* | 10/2010 | Mori | H01J 37/32091 216/67 |
| 2011/0031216 | A1* | 2/2011 | Liao | H01J 37/32082 216/67 |
| 2011/0248634 | A1* | 10/2011 | Heil | H01J 37/32091 315/111.41 |
| 2011/0318933 | A1* | 12/2011 | Yatsuda | H01J 37/32091 438/712 |
| 2012/0273341 | A1 | 11/2012 | Agarwal et al. | |
| 2013/0122711 | A1* | 5/2013 | Marakhtanov | H01J 37/32091 438/711 |
| 2014/0083977 | A1 | 3/2014 | Ui et al. | |
| 2016/0372307 | A1* | 12/2016 | Yang | H01J 37/32568 |
| 2017/0169996 | A1 | 6/2017 | Ui et al. | |

FOREIGN PATENT DOCUMENTS

| | | |
|---|---|---|
| JP | 2008-244429 A | 10/2008 |
| JP | 2014-229751 A | 12/2014 |
| KR | 2014-0040640 A | 4/2014 |

OTHER PUBLICATIONS

Office Action dated Jul. 2, 2019 in Japanese Application No. 2016-181131.

* cited by examiner

FIG. 10A
FIG. 10B
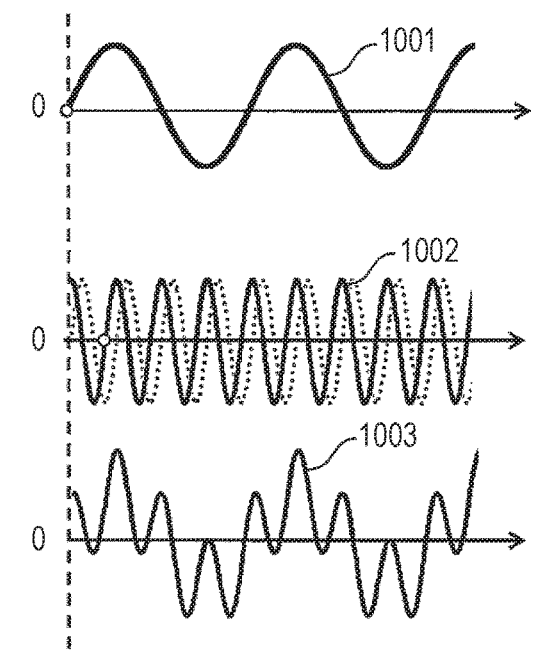
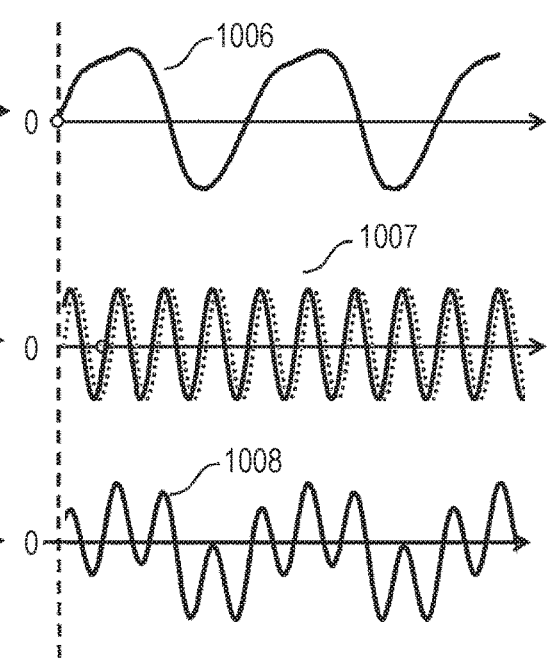
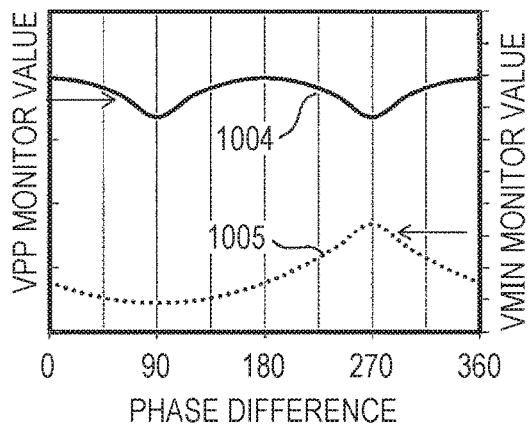
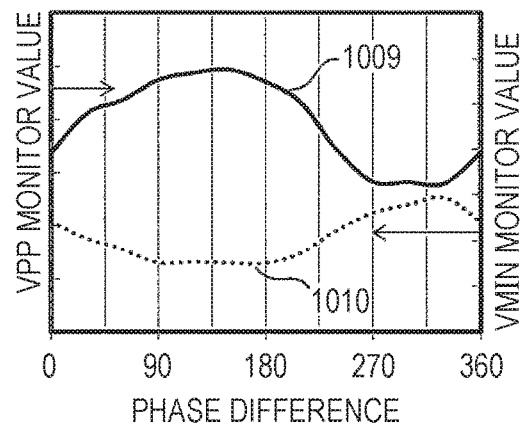

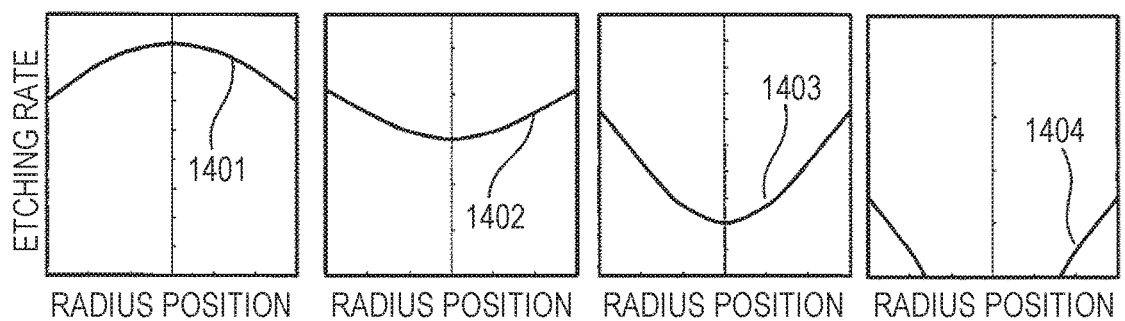
FIG. 14A  FIG. 14B  FIG. 14C  FIG. 14D
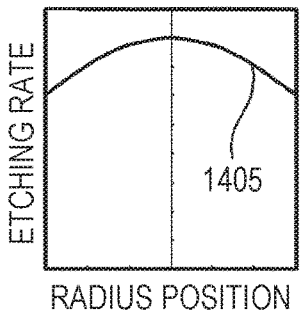
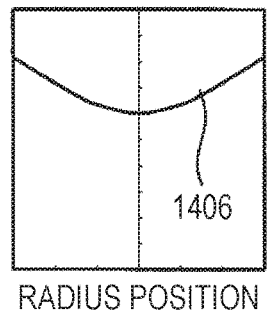
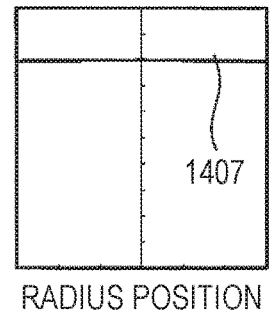
FIG. 14E  FIG. 14F  FIG. 14G

PLASMA PROCESSING APPARATUS AND PLASMA PROCESSING METHOD

BACKGROUND OF THE INVENTION

1. Field of the Invention

The present invention relates to a plasma processing technique.

2. Description of the Related Art

Some conventional plasma processing apparatuses include a distribution control function to control especially such as an ion energy distribution to improve or control unevenness on a wafer surface by such as an etching rate.

JP 2008-244429 A describes a prior art example regarding improvement of unevenness on a wafer surface in processing by a plasma processing apparatus. The plasma processing apparatus described in JP 2008-244429 A includes a plurality of radio frequency bias sources having different frequencies to control distribution of energy incident on a wafer, and the radio frequency bias sources are superimposed, and biases are applied to a same electrode.

Further, JP 2008-60429 A discloses a plasma processing apparatus which is a parallel-plate type plasma processing apparatus. The plasma processing apparatus includes ion energy suitable for substrate processing. A width of the ion energy is reduced, and a processing shape of a substrate can be accurately controlled. In a vacuum chamber, with respect to an RF electrode disposed to face a counter electrode, a first RF voltage having a first frequency and a second RF voltage having a second frequency which is integer times of a half of the first frequency and different from the first frequency are phase-controlled, superimposed, and applied by a gate trigger device in each of a first RF voltage applying means and a second RF voltage applying means.

SUMMARY OF THE INVENTION

There are following issues in the case where wafer in-plane distribution is controlled while controlling two frequency bias powers by applying radio frequency biases having two different frequencies. For example, even in the case where desired distribution control is performed such that the distribution becomes flat in a radius direction on a wafer surface, unlike an intention, an in-plane uniform etching shape or a high selection ratio may not be obtained.

It has been found that a high selection ratio is not obtained since ion energy increases especially around a wafer since two radio frequency biases are superimposed, and wafer in-plane distribution cannot be controlled at a selection ratio. However, techniques disclosed in JP 2008-244429 A and JP 2008-60429 A, the issue that ion energy increases especially around a wafer since two radio frequency biases are superimposed is not considered.

Further, when phases of two frequencies and two biases are not controlled, these two different bias voltages change in each time cycle, and waveforms are not constant. As a result, a constant etching processing is not performed, and a uniformity, a selection ratio, an etching form are varied. JP 2008-60429 A discloses a point that two radio frequency biases control each phase. However, the control is a phase control to reduce an energy width. Therefore, JP 2008-60429 A does not disclose and suggest a phase control to reduce variation of a uniformity, a selection ratio, and an etching shape.

Therefore, the present invention provides a plasma processing apparatus and a plasma processing method in which, in a plasma processing apparatus having a function of two frequency biases, wafer in-plane uniformity in plasma processing, a desired distribution control of an etching rate, and a high selection ratio can be achieved.

A plasma processing apparatus according to the present invention includes a processing chamber, a first radio frequency power source, a sample stage, and a second radio frequency power source. A sample is processed by using plasma in the processing chamber. The first radio frequency power source supplies radio frequency power to generate the plasma. The sample is placed on the sample stage. The second radio frequency power source applies a first radio frequency voltage to the sample stage. The plasma processing apparatus further includes a third radio frequency power source and a controller. The third radio frequency power source applies, to the sample stage, a second radio frequency voltage having a frequency which is N times a frequency of the first radio frequency voltage in a case where N is a natural number of 2 or more. The controller controls a phase of the first radio frequency voltage and a phase of the second radio frequency voltage such that a phase difference between the phase of the first radio frequency voltage and the phase of the second radio frequency voltage reaches a predetermined value.

Further, the plasma processing apparatus according to the present invention includes a processing chamber, a first radio frequency power source, a sample stage, and a second radio frequency power source. A sample is processed by using plasma in the processing chamber. The first radio frequency power source supplies radio frequency power to generate the plasma. The sample is placed on the sample stage. The second radio frequency power source applies the first radio frequency power to the sample stage. The plasma processing apparatus includes a third radio frequency power and a pulse controller. The third radio frequency power source applies, to the sample stage, the second radio frequency voltage. The pulse controller generates a pulse to temporally modulate a phase difference between a phase of the first radio frequency voltage and a phase of the second radio frequency voltage.

Furthermore, according to the present invention, in a plasma processing method in which a sample placed on a sample stage is processed by using plasma, a first radio frequency voltage and a second radio frequency voltage having a frequency which is N times a frequency of the first radio frequency voltage is applied to the sample stage in a case where N is a natural number of 2 or more, and a phase of the first radio frequency voltage and a phase of the second radio frequency voltage are controlled such that a phase difference between a phase of the first radio frequency voltage and a phase of the second radio frequency voltage reaches a predetermined value.

Furthermore, in the present invention, in the plasma processing method in which a sample placed on a sample stage is processed by using plasma, a first radio frequency voltage and a second radio frequency voltage are applied to the sample stage, and a phase difference between a phase of the first radio frequency voltage and a phase of the second radio frequency voltage is temporally modulated.

According to the present invention, in a plasma processing apparatus having a function of two frequency biases, wafer in-plane uniformity in plasma processing, a desired distribution control of an etching rate, and a high selection ratio can be achieved.

BRIEF DESCRIPTION OF THE DRAWINGS

FIGS. 10A and 10B are diagrams illustrating the case where a frequency ratio between radio frequency biases on a lower frequency side and on a higher frequency side is 4;

FIGS. 14A to 14G are diagrams illustrating frequency dependence of a radio frequency bias in a wafer in-plane distribution of an etching rate;

DESCRIPTION OF THE PREFERRED EMBODIMENTS

An embodiment of the present invention will be described below with reference to drawings.

Figure 1:
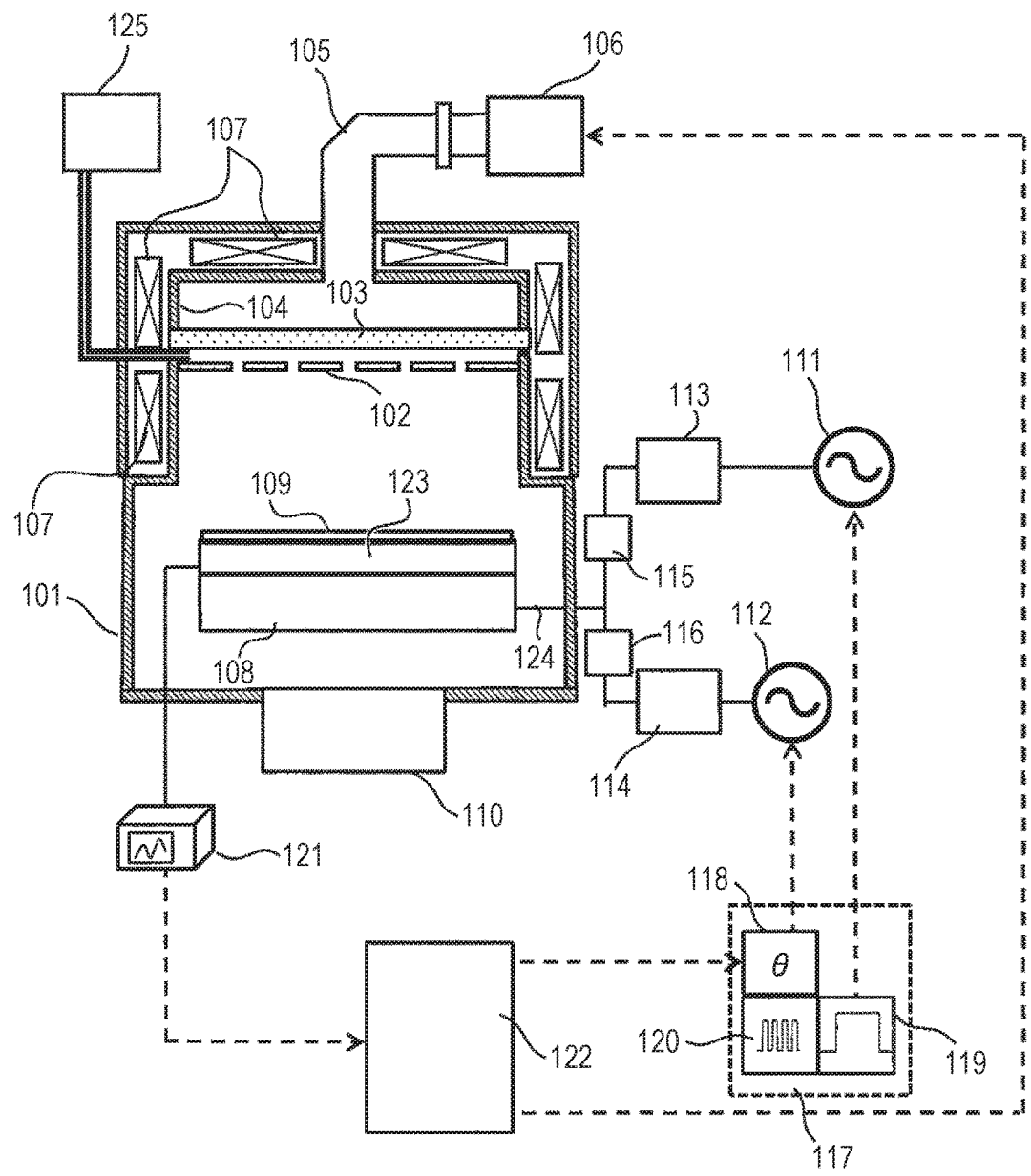
FIG. 1 is a diagram illustrating a configuration of a plasma processing apparatus according to an embodiment of the present invention.

FIG. 1 illustrates a configuration of a plasma processing apparatus according to an embodiment of the present invention. Further, the plasma processing apparatus illustrated in FIG. 1 is a plasma etching device which generates plasma by using microwave electron cyclotron resonance (ECR) and performs plasma etching processing by the generated plasma.

An evacuation device (not illustrated) is connected to a processing chamber 101 via an evacuation port 110. A shower plate 102 and a window 103 are disposed at an upper portion of the processing chamber 101. The shower plate 102 includes a hole, and a material of the shower plate is, for example, quartz. A plasma etching process gas to be supplied from a gas supply mechanism 125 is introduced in the processing chamber 101 through the hole of the shower plate. The window 103 is disposed at an upper portion of the shower plate 102, and a space for gas supply is provided between the window 103 and the shower plate 102. The window 103 transmits electromagnetic waves from an upper side and airtightly seals the upper side of the processing chamber 101. Dielectric material, for example, quarts, is used as a material of the window 103.

A cavity resonator 104 is disposed on the window 103. An upper portion of the cavity resonator 104 is opened and connected to a waveguide 105. The waveguide 105 includes a vertical waveguide extending in a vertical direction and a waveguide converter which is a corner to bend a direction of electromagnetic waves at right angle. The waveguide 105 is an oscillation waveguide which propagates electromagnetic waves, and a radio frequency power source for plasma generation 106 which is a first radio frequency power source is connected to an end of the waveguide 105.

The radio frequency power source for plasma generation 106 is a power source to generate electromagnetic waves for plasma generation and generates electromagnetic waves based on control by a controller 122. In the embodiment, as a frequency of electromagnetic waves, microwaves of 2.45 GHz are used. Electromagnetic waves generated from the radio frequency power source for plasma generation 106 are propagated in the waveguide 105 and propagated in the processing chamber 101 through the cavity resonator 104, the window 103, and the shower plate 102. A magnetic field generation coil 107 is disposed around the processing chamber 101. The magnetic field generation coil 107 forms a magnetic field in the processing chamber 101. Power oscillated from the radio frequency power source for plasma generation 106 generates high-density plasma in the processing chamber 101 by an interaction with a magnetic field formed by the magnetic field generation coil 107.

A sample stage 108 is disposed to face the window 103 on a lower side of the processing chamber 101. A substrate to be processed 109 which is a sample is placed and held on an upper surface of the sample stage 108. Further, central axis of the waveguide 105, the processing chamber 101, the sample stage 108, and the substrate to be processed 109 are coincident. A material of the sample stage 108 is aluminum and titanium. An upper surface which is a part of the sample stage 108 includes a conductor film 123. A sprayed film (not illustrated) including such as alumina ceramics is disposed on an upper surface of the conductor film 123 of the sample stage 108.

An electrode to electrostatically attract the substrate to be processed 109 is included in the sample stage 108, and the substrate to be processed 109 is electrostatically attracted by applying a DC voltage. Further, a radio frequency voltage is applied to the sample stage 108 from each of a first RF bias power source 111 and a second RF bias power source 112. The second RF bias power source 112 which is a third radio frequency power source applies, to the sample stage 108, a radio frequency voltage having a frequency higher than a frequency of the first RF bias power source 111 which is a second radio frequency power source. A frequency of the second RF bias power source 112 is a frequency which is N times (N is an integer of 2 or greater) a frequency of the first RF bias power source 111. A frequency of the second RF bias power source is preferably equal to or greater than 1 MHz from the viewpoint of in-plane distribution control of an etching rate to be described below.

In addition, each of the first radio frequency bias power source 111 and the second radio frequency bias power source 112 can oscillate in a frequency domain with width on the basis of a central oscillation frequency. However, a final frequency of the first radio frequency bias power source 111 is determined by a signal from a lower frequency-side pulsar 119 in a pulse controller 117, and a final frequency of the second radio frequency bias power source 112 is determined by a signal from a higher frequency-side pulsar 120. Further, if a minimum frequency of a radio frequency bias is too low, damage is caused. Therefore, the minimum frequency is set to 100 kHz or greater, and a maximum frequency is set to approximately 13.56 MHz or lower since the maximum frequency needs to be lower than a frequency for plasma generation.

In addition, the first radio frequency bias power source 111 is matched by a lower frequency-side matching box 113, and the second radio frequency bias power source 112 is matched by a higher frequency-side matching box 114. A low pass filter 115 is connected on a side of the sample stage 108 of the lower frequency-side matching box 113. A high pass filter 116 is connected on the sample stage 108 side of the higher frequency-side matching box 114. A mutual interference from each of the first radio frequency bias power source 111 and the second radio frequency bias power source 112 is filtered. Further, to monitor voltage applied by each of the first radio frequency bias power source 111 and the second radio frequency bias power source 112 and superimposed, a voltage of the conductor film 123 in the sample stage 108 is monitored by the voltage monitor 121.

An outline of plasma processing in the above-described plasma processing apparatus is as described below.

The substrate to be processed 109, such as a wafer, is carried in the processing chamber 101 and placed on the conductor film 123 of the sample stage 108. The substrate to be processed 109 placed on the sample stage 108 is electrostatically attracted and held at a predetermined position on the sample stage 108 by an electrostatic force generated by a DC voltage applied by a DC current. Then, in the decompressed processing chamber 101 in a vacuum state, a plasma etching process gas is supplied from a gas supply mechanism 125 via a mass flow controller (not illustrated).

The gas is introduced in the processing chamber 101 from a hole of the shower plate 102 through a space between the window 103 and the shower plate 102. The inside of the processing chamber 101 is controlled to a predetermined pressure while controlling an evaluation device. Then, electromagnetic waves are oscillated from the radio frequency power source for plasma generation 106, and plasma is generated in the processing chamber 101 by an interaction with electromagnetic waves transmitted in the processing chamber 101 in a vacuum state and a magnetic field formed by the magnetic field generation coil 107.

At the same time with plasma ignition, a radio frequency voltage is applied from each of the first radio frequency bias power source 111 and the second radio frequency bias power source 112 to the sample stage 108 in the processing chamber 101 by control by the controller 122. Ion is pulled to the substrate to be processed 109 from plasma by a radio frequency bias voltage on which radio frequency voltages each from the two radio frequency bias power sources are superimposed. Consequently, plasma etching processing is performed on an upper surface of the substrate to be processed 109. In this case, gas and reaction products generated by etching are exhausted through the evacuation port 110 provided on a lower side of the processing chamber 101.

Next, application of a radio frequency voltage to the sample stage 108 by the pulse controller 117 including the higher frequency-side pulsar 120, the lower frequency-side pulsar 119, and a phase shifter 118 will be described with reference to FIGS. 2A to 2C.

When a radio frequency voltage is applied each from the first radio frequency bias power source 111 and the second radio frequency bias power source 112 to the sample stage 108, a rectangular wave signal 201 is output from the higher frequency-side pulsar 120, and a rectangular wave signal 203 is output from the lower frequency-side pulsar 119. Further, a frequency ratio between the signals 201 and 203 is N times (an integer of 2 or greater), and as illustrated in FIG. 2A, the signals are output in a state in which a phase difference is zero degree such that output of the lower frequency-side pulsar 119 and output of the higher frequency-side pulsar 120 rise at the same time.

Figure 2A:
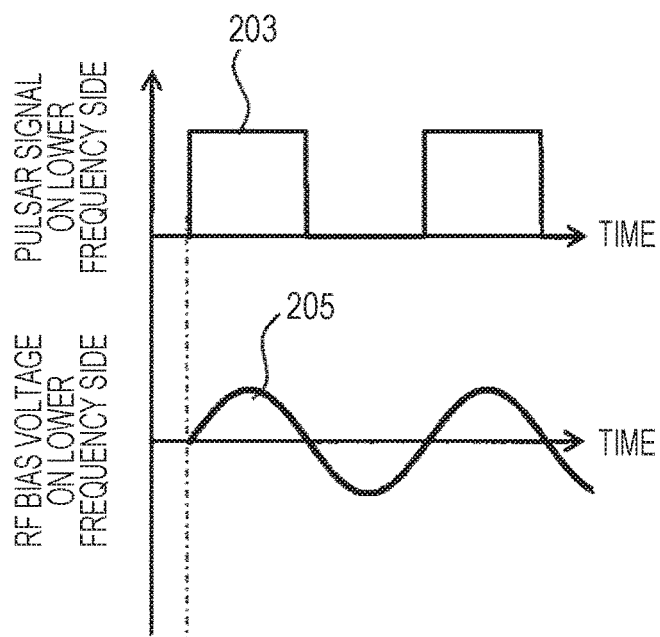
FIGS. 2A to 2C are diagrams illustrating waveforms of voltages applied to a sample stage by a pulse controller.
Figure 2B:
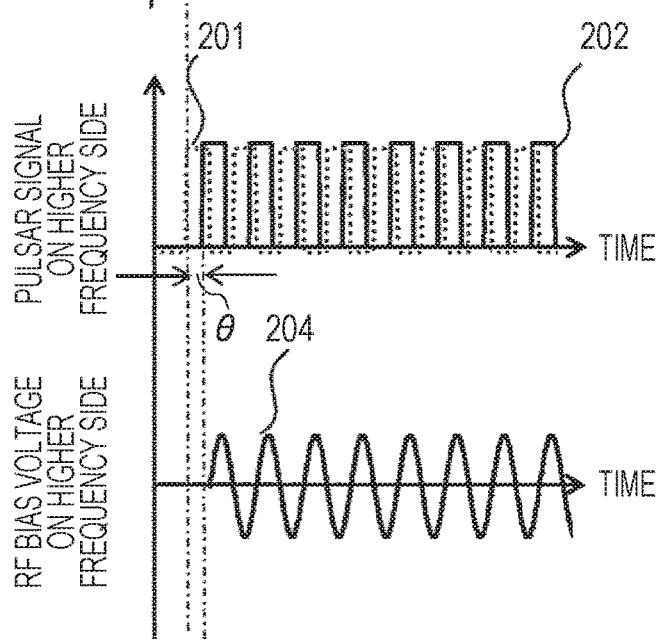
Figure 2C:
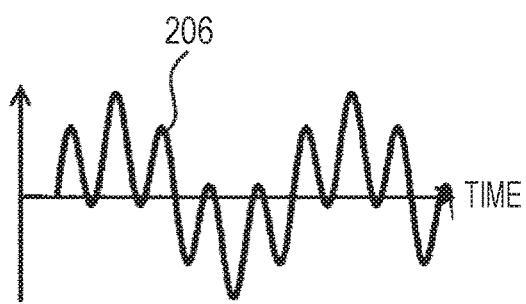

Next, the signal 201, indicated by dotted lines, from the higher frequency-side pulsar 120 has a phase delay of $\theta$ with respect to the lower frequency-side signal 203 through the phase shifter 118 as illustrated in FIG. 2A, and the signal 201 becomes the higher frequency-side signal 202 and forms a phase difference $\theta$ with the lower frequency-side signal 203. The phase difference $\theta$ by the phase shifter 118 calculated and correctly controlled by a voltage monitor value to be described later is output by the controller 122.

The lower frequency-side signal 203 is sent to the first radio frequency bias power source 111. The first radio frequency bias power source 111 applies a rough sine-wave radio frequency power 205 of one cycle to the sample stage 108 with respect to a rise of one pulse of the lower frequency-side signal 203 as illustrated in FIG. 2B. In addition, the higher frequency-side signal 201 is sent to the second radio frequency bias power source 112, and the second radio frequency bias power source 112 applies a rough sine-wave radio frequency power 204 of one cycle to the sample stage 108 with respect to the rise of one pulse of the higher frequency-side signal 201 as illustrated in FIG. 2B.

Next, a radio frequency voltage applied from the first radio frequency bias power source 111 through the lower frequency-side matching box 113 and the low pass filter 115 and a radio frequency voltage applied from the second radio frequency bias power source 112 through the higher frequency-side matching box 114 and the high pass filter 116 are joined in a power supply line 124. By applying the joined radio frequency voltage to the sample stage 108, a radio frequency voltage applied from the first radio frequency bias power source 111 and a radio frequency voltage applied from the second radio frequency bias power source 112 are superimposed, and a radio frequency voltage with a waveform 206 as illustrated in FIG. 2C is applied to the sample stage 108.

The superimposed radio frequency voltage with the waveform 206 is detected by the voltage monitor 121. The voltage monitor 121 includes an A/D converter and has high time resolution. The voltage monitor 121 detects a voltage of the superimposed radio frequency bias, the waveform 206 of the superimposed radio frequency bias, a peak-to-peak voltage (Vpp) value of the superimposed radio frequency bias, and a minimum value (Vmin) of a voltage of the superimposed radio frequency bias. Further, preferably, the voltage monitor 121 outputs a peak-to-peak voltage (Vpp) of a lower frequency-side frequency material and a peak-to peak voltage (Vpp) of a higher frequency-side frequency material by Fourier-transforming a waveform of the superimposed radio frequency bias. Further, in the embodiment, especially, a radio frequency bias voltage on a higher frequency side needs to measure without a phase delay. Therefore, the voltage monitor 121 is preferably disposed to the conductor film 123 of the sample stage 108 disposed close to the substrate to be processed 109 or plasma from the power supply line 124.

Next, etching distribution controllability by a frequency of a radio frequency bias will be described with reference to FIGS. 14A to 14G.

An etching rate distribution is a mid-to high distribution 1401 as illustrated in FIG. 14A by an interaction between an impedance in plasma and a magnetic field generated by a magnetic coil, for example, in the case where a frequency of the radio frequency bias power source is several hundred kHz. Then, in the case where a frequency of the radio frequency bias power source is 1 to 2 MHz, the etching rate distribution becomes a slightly outside-high distribution 1402 as illustrated in FIG. 14B. In the case where a frequency of the radio frequency bias power source is 4 MHz, the etching distribution becomes a significantly outside-high distribution 1403 as illustrated in FIG. 14C. Further, in the case where a frequency of the radio frequency bias power source is higher than 10 MHz, plasma starts to be generated on an outer side of a sample stage as illustrated in FIG. 14D and the etching rate distribution becomes an extreme distribution such as a distribution 1404 in which an etching rate is extremely reduced, or etching is stopped.

A uniform etching process becomes possible when a frequency of each of a lower frequency-side radio frequency bias and a higher frequency-side radio frequency bias is adjusted such that an etching rate distribution becomes flat by applying and superimposing the lower frequency-side radio frequency bias and the higher frequency-side radio frequency bias by using such the etching rate distribution characteristics of each frequency. For example, a uniform etching rate distribution 1407 as illustrated in FIG. 14G can be obtained by superimposing and applying a lower frequency-side radio frequency bias of a frequency with a middle-high distribution 1405 by applying a lower frequency-side radio frequency bias as illustrated in FIG. 14E and a higher frequency-side radio frequency bias of a frequency with an outside-high distribution 1406 by applying a higher frequency-side radio frequency bias as illustrated in FIG. 14F.

As described above, especially, a desired etching rate distribution can be easily obtained when a frequency ratio is adjusted by a frequency of the higher frequency-side radio frequency bias by fixing a frequency of the lower frequency-side radio frequency bias. Therefore, a frequency ratio is preferably adjusted by a frequency of the higher frequency-side radio frequency bias by fixing a frequency of the lower frequency-side radio frequency bias.

Figure 15A:
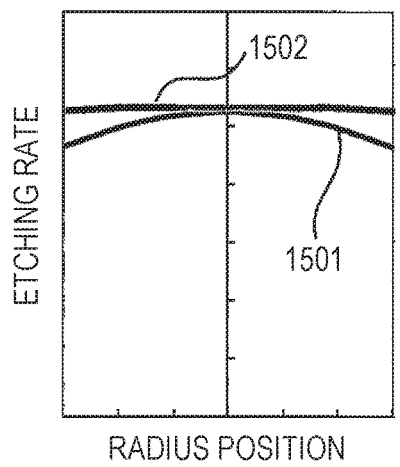
FIGS. 15A and 15B are diagrams illustrating a wafer in-plane distribution of an etching rate and a selection ratio by two radio frequency biases.
Figure 15B:
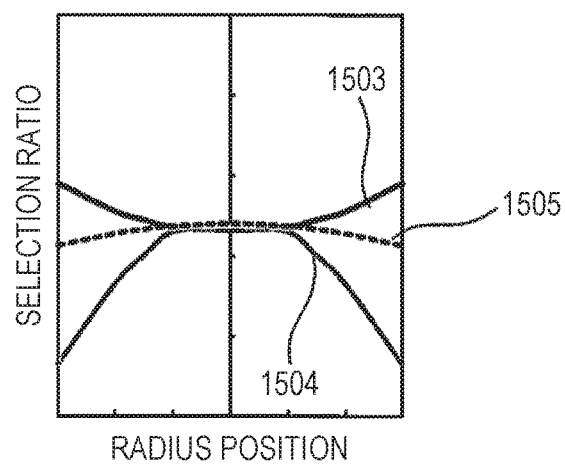
Figure 16A:
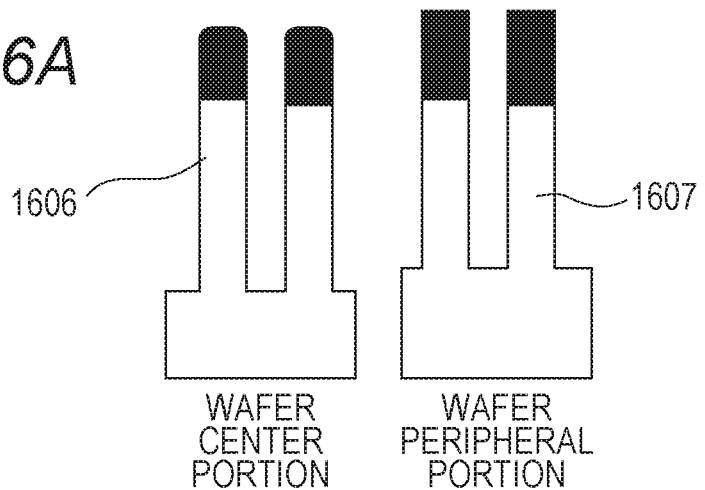
FIGS. 16A to 16C are diagrams illustrating shape results by two radio frequency biases.
Figure 16B:
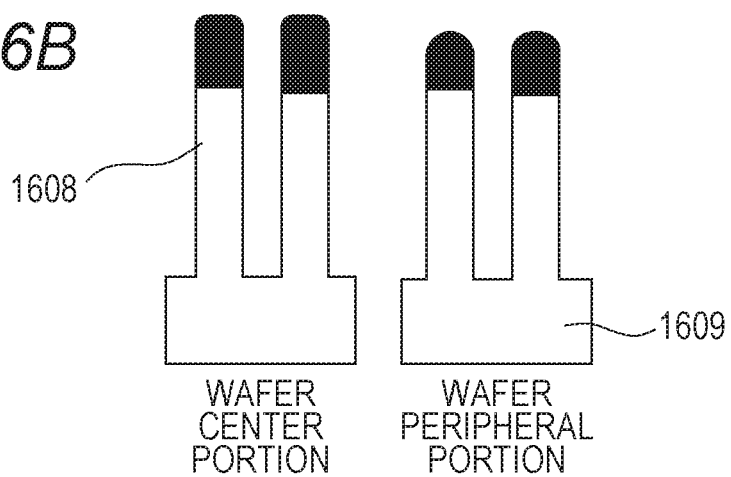
Figure 16C:
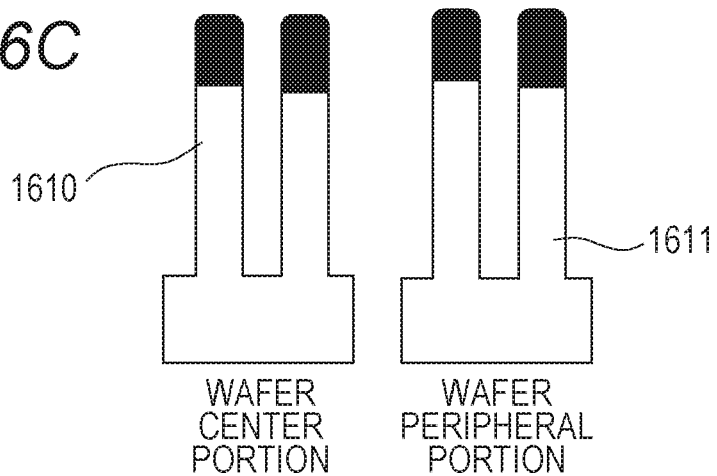

Next, a relationship of an etching rate distribution, a selection rate distribution, and a shape distribution will be described with reference to FIGS. 15A and 15B. FIG. 15A illustrates an etching rate distribution. FIG. 15B illustrates a selection ratio distribution. FIGS. 16A to 16C indicate a shape distribution.

An etching rate distribution becomes a middle-high distribution 1501 when a lower frequency-side radio frequency bias is applied, in other words, by applying by a conventional one radio frequency bias power source. On the other hand, a selection ratio has an outside-high distribution 1503, and a selection ratio of a wafer center portion is deteriorated. As a result, each shape of the center and the periphery of a wafer becomes 1606 and 1607 illustrated in FIG. 16A, and a mask and a film to be etched need to be adjusted to be in-plane uniformity.

Accordingly, in the case where a distribution of an etching rate becomes a uniform distribution 1502 by adjusting each frequency of radio frequency biases on a lower frequency side and a higher frequency side, a selection ratio distribution becomes a middle-high distribution as indicated by 1504, and a selection ratio of the periphery is significantly deteriorated. As a result, as illustrated in FIG. 16B, shapes of the center and the periphery of a wafer are indicated by 1608 and 1609 respectively, and the height of a mask needs to be adjusted. In this case, a phase difference between two radio frequency biases is not adjusted.

Next, in the case where each frequency of radio frequency biases on a lower frequency side and a higher frequency side is adjusted, and a peak-to-peak voltage of a voltage on which a phase difference of two radio frequency biases is superimposed is minimized, a deterioration of the selection ratio of the periphery can be suppressed, and the etching rate distribution 1502 and a selection ratio distribution 1505 are roughly equalized. Therefore, a shape of a wafer center portion 1610 and a shape of a wafer peripheral portion 1611 become substantially the same as illustrated in FIG. 16C.

Figure 3:
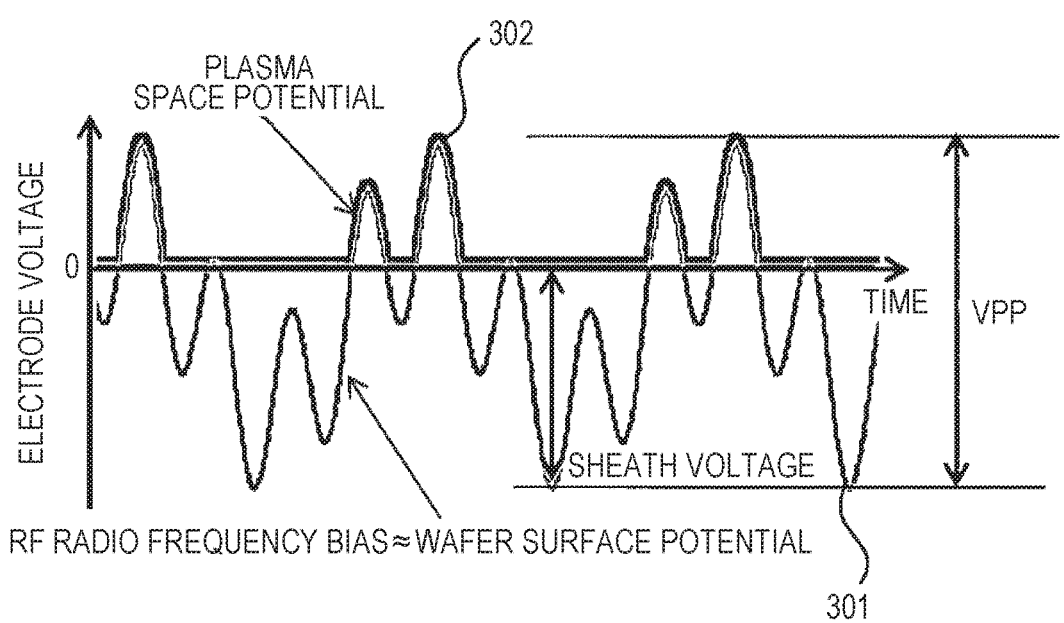
FIG. 3 is a diagram illustrating two radio frequency bias voltages superimposed and applied to a sample stage.

Next, FIG. 3 illustrates a relationship of a peak-to peak voltage (Vpp) and a sheath voltage of a voltage applied to the sample stage 108 in the case where two different frequency biases are superimposed and applied. In FIG. 3, 301 indicates a monitor value by the voltage monitor 121 of a radio frequency voltage applied to the sample stage 108 in the case where two different frequency biases are superimposed and applied. Here, a voltage value monitored by the voltage monitor 121 and a wafer surface potential are slightly varied by being affected by a capacitance of a sprayed film on a surface of the sample stage 108. However, the variation gives no problem to substitute a wafer potential for a monitored voltage value, and therefore the wafer potential is used instead of the monitored voltage value. In FIG. 3, 302 indicates a plasma space potential.

As a result of an experiment and a consideration by an inventor of the present invention, a frequency of each radio frequency bias power source is in the range of 400 KHz to 4 MHz, in a frequency domain in which ion energy can follow a change of a wafer potential, the wafer potential, a plasma space potential 502, and a sheath voltage can be roughly calculated by using a voltage waveform 301 by the voltage monitor 121, and ion energy incident on a wafer can be roughly determined by a size of the sheath voltage. Further, the inventor has found an inverse correlation among Vpp which is a difference from a maximum value to a minimum value of an amplitude of a voltage 501 monitored by the voltage monitor 121, VMIN which is a minimum value of the voltage monitored by the voltage monitor 121, and a selection ratio. This means that the selection ratio can be improved by controlling a phase difference so as to minimize Vpp of the voltage 501 monitored by the voltage monitor 121.

Table 1 indicates a desired phase difference to minimize Vpp of a voltage monitored by the voltage monitor 121 in the case where two high voltage biases are applied by superimposing a radio frequency bias on a lower frequency side and a radio frequency bias on a higher frequency side having a frequency of twice or more integer times as many as a low frequency. For simple simulation, each radio frequency bias waveform is a perfect sine wave, and each Vpp is the same.

TABLE 1

| Condition | Radio frequency bias | | Higher frequency side/lower frequency side | Control method |
|---|---|---|---|---|
| | Lower frequency side Frequency (Hz) | Higher frequency side Frequency (Hz) | Phase difference (degree) | |
| 1 | F | (4N) × F | Delay on higher frequency side at 270 degrees | Minimum VPP and maximum VMIN |
| | Frequency ratio 1:4, 1:8, 1:12, . . . | | | |
| 2 | F | (4N + 1) × F | Delay on higher frequency side at 180 degrees | Minimum VPP |
| | Frequency ratio 1:5, 1:9, 1:13, . . . | | | |
| 3 | F | (4N − 2) × F | Delay on higher frequency side at 90 degrees | Minimum VPP and maximum VMIN |
| | Frequency ratio 1:2, 1:6, 1:10, . . . | | | |
| 4 | F | (4N − 1) × F | Zero-degree phase difference | Minimum VPP |
| | Frequency ratio 1:3, 1:8, 1:12, . . . | | | |

As indicated in Table 1, in the case where a frequency ratio between radio frequency biases on a lower frequency side and a higher frequency side is 4N, a phase difference to minimize Vpp and maximize VMIN is 270 degrees. In the case where a frequency ratio between radio frequency biases on a lower frequency side and a higher frequency side is 4N+1, a phase difference to minimize Vpp is 180 degrees. Further, as indicated in Table 1, in the case where a frequency ratio between radio frequency biases on a lower frequency side and a higher frequency side is 4N−2, a phase difference to minimize Vpp and maximize VMIN is 90 degrees. In the case where a frequency ratio between radio frequency biases on a lower frequency side and a higher frequency side is 4N−1, a phase difference to minimize Vpp is 0 degree. N is a natural number. Furthermore, in the case where a frequency ratio between radio frequency biases on a lower frequency side and a higher frequency side is 4N or 4N−2, in other words, in the case where the frequency ratio between the radio frequency biases on a lower frequency side and a higher frequency side is an even number, two phase differences to minimize Vpp are included in the range from 0 to 360 degrees. Therefore, in two differences, a difference with a smaller VMIN absolute value (VMIN is maximized) is selected.

Next, FIGS. 4A to 4D illustrate voltage waveforms in which a radio frequency bias voltage waveform on a lower frequency side, a radio frequency bias voltage waveform on a higher frequency side, and radio frequency biases on a lower frequency side and a higher frequency side are superimposed in the case where a frequency ratio between radio frequency biases on a lower frequency side and a higher frequency side is each of 4N, 4N+1, 4N, 4N−2, and 4N−1.

Figure 4A:
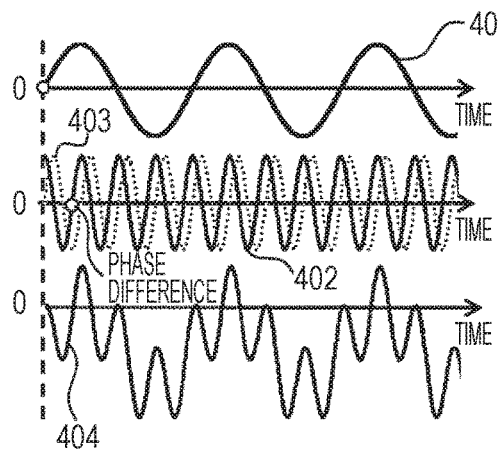
FIGS. 4A to 4D are diagrams illustrating superimposed voltages with respect to a frequency ratio of two radio frequency biases.

FIG. 4A illustrates the case where a frequency ratio between radio frequency biases on a lower frequency side and a radio frequency ratio is 4N. A waveform 401 indicates a radio frequency bias voltage waveform on a lower frequency side. Waveforms 402 and 403 indicate radio frequency bias voltage waveforms on a higher frequency side. A waveform 404 indicates a voltage waveform on which radio frequency biases on a lower frequency side and a higher frequency side are superimposed. Here, the dotted line waveform 402 is in a state in which initial phases of a high-frequency side bias and a low-frequency side bias are consistent. A phase difference in this case is 0 degree. In addition, the solid line waveform 403 indicates a waveform in which a radio frequency bias on a higher frequency side is delayed at 270 degrees in comparison with the dotted line waveform 402. A phase difference in this case is 270 degrees.

In the waveform 404, the sum of a radio frequency bias voltage on a lower frequency side and a radio frequency bias voltage on a higher frequency side is almost equal. However, the waveform 404 is shifted on a minus side by the effect of self-bias. Further, in the waveform 404 with the phase difference of 270 degrees, Vpp is minimized, and VMIN is maximized in the range of a phase difference of 0 to 360 degrees. Therefore, the waveform 404 is preferred when a frequency ratio between radio frequency biases on a lower frequency side and a higher frequency side is 4.

Figure 4B:
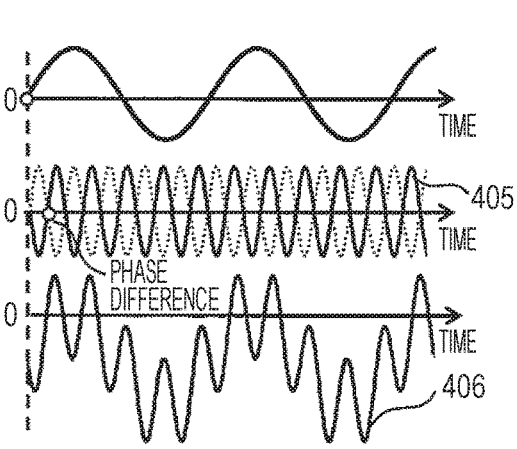

FIG. 4B illustrates the case where a frequency ratio between radio frequency biases on a lower frequency side and a radio frequency ratio is 4N+1. A waveform 405 indicates a radio frequency bias voltage waveform on a higher frequency side. A waveform 406 indicates a voltage waveform on which radio frequency biases on a lower frequency side and a higher frequency side are superimposed. In the waveform 406, Vpp is minimized at a phase difference of 180 degrees, and the waveform 406 is preferred when a frequency ratio between radio frequency biases on a lower frequency side and a higher frequency side is 5.

Figure 4C:
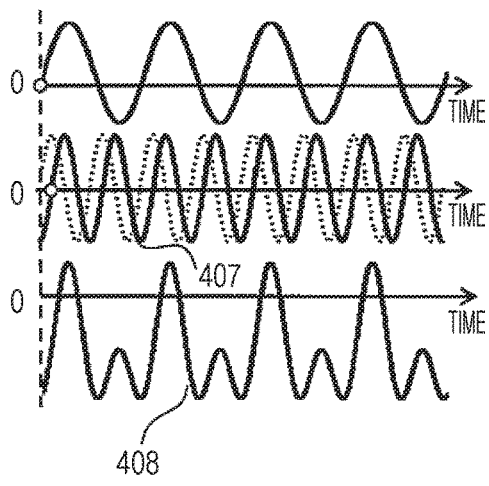

FIG. 4C illustrates the case where a frequency ratio between radio frequency biases on a lower frequency side and a radio frequency ratio is 4N−2. A waveform 407 indicates a radio frequency bias voltage waveform on a higher frequency side. A waveform 408 indicates a voltage waveform on which radio frequency biases on a lower frequency side and a higher frequency side are superimposed. In the waveform 408, Vpp is minimized and VMIN is maximized at a phase difference of 90 degrees, and the waveform 408 is preferred when a frequency ratio between radio frequency biases on a lower frequency side and a higher frequency side is 2.

Figure 4D:
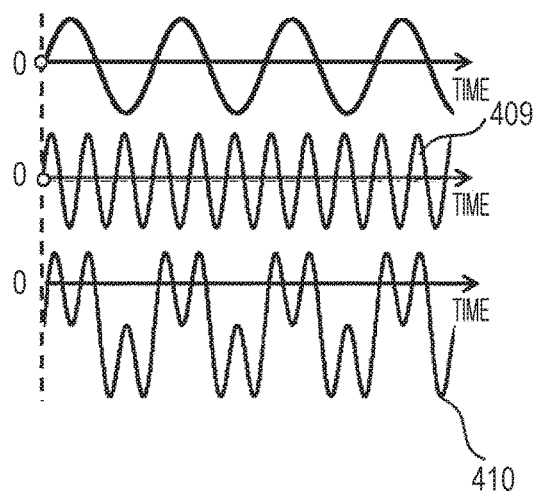

FIG. 4D illustrates the case where a frequency ratio between radio frequency biases on a lower frequency side and a higher frequency side is 4N−1. A waveform 409 indicates a radio frequency bias voltage waveform on a higher frequency side. A waveform 410 indicates a voltage waveform on which radio frequency biases on a lower frequency side and a higher frequency side are superimposed. In the waveform 410, Vpp is minimized at a phase difference of 0 degree, and the waveform 410 is preferred when a frequency ratio between radio frequency biases on a lower frequency side and a higher frequency side is 3.

As illustrated in FIGS. 4A to 4D, in the waveforms 404, 406, 408, and 410, as a frequency ratio is increased, the effect to reduce Vpp is decreased, although the frequency ratio is reduced in comparison with the sum of Vpp of a radio frequency bias on a higher frequency side and a radio frequency bias on a lower frequency side. Specifically, if a frequency ratio of radio frequency biases on a higher frequency side and a lower frequency side is excessively increased, a superimposed voltage waveform and Vpp are substantially not changed. Therefore, the frequency ratio between radio frequency biases on a higher frequency side and a lower frequency side is preferably 2 to 15 or less.

Next, a method for setting a phase difference between radio frequency biases on a higher frequency side and a lower frequency side in the case where a frequency ratio between the radio frequency biases on a higher frequency side and a lower frequency side is 5 will be described with reference to FIG. 5. Further, FIG. 6 indicates phase difference dependence with respect to Vpp and VMIN. A curve line 601 indicates phase difference dependence with respect to Vpp, and a polarity 602 indicates a phase difference dependence with respect to VMIN.

Actual etching is affected by a phase change of a radio frequency bias by being matched by each matching box, a phase change by a low pass/high pass filter circuit, a delay by a power transmission cable, a change in transfer by a structure and a capacity in a sample stage, and a phase change by the effects of plasma and a magnetic field. Even if application of two radio frequency biases is controlled by the phase shifter 118, a difference is generated between a phase θ of the phase shifter and an actual phase difference between two radio frequency biases.

Figure 5:
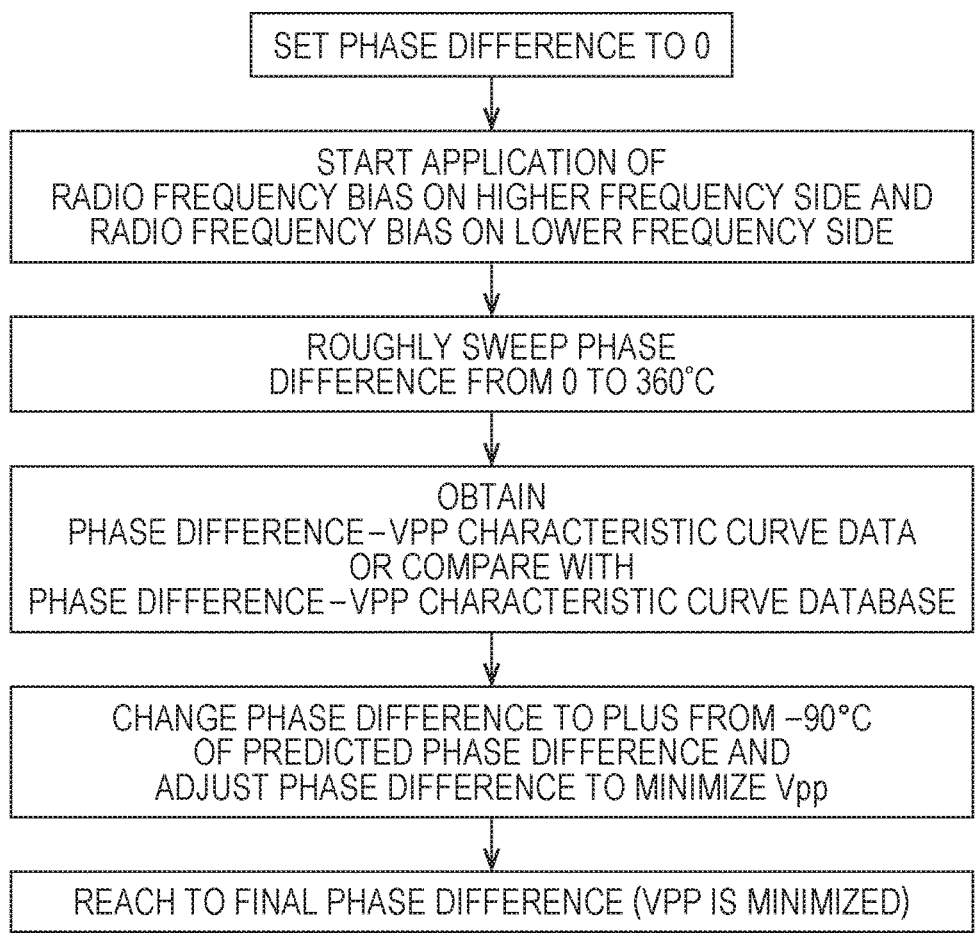
FIG. 5 is a flowchart illustrating a control of a phase difference of two radio frequency biases.
Figure 6:
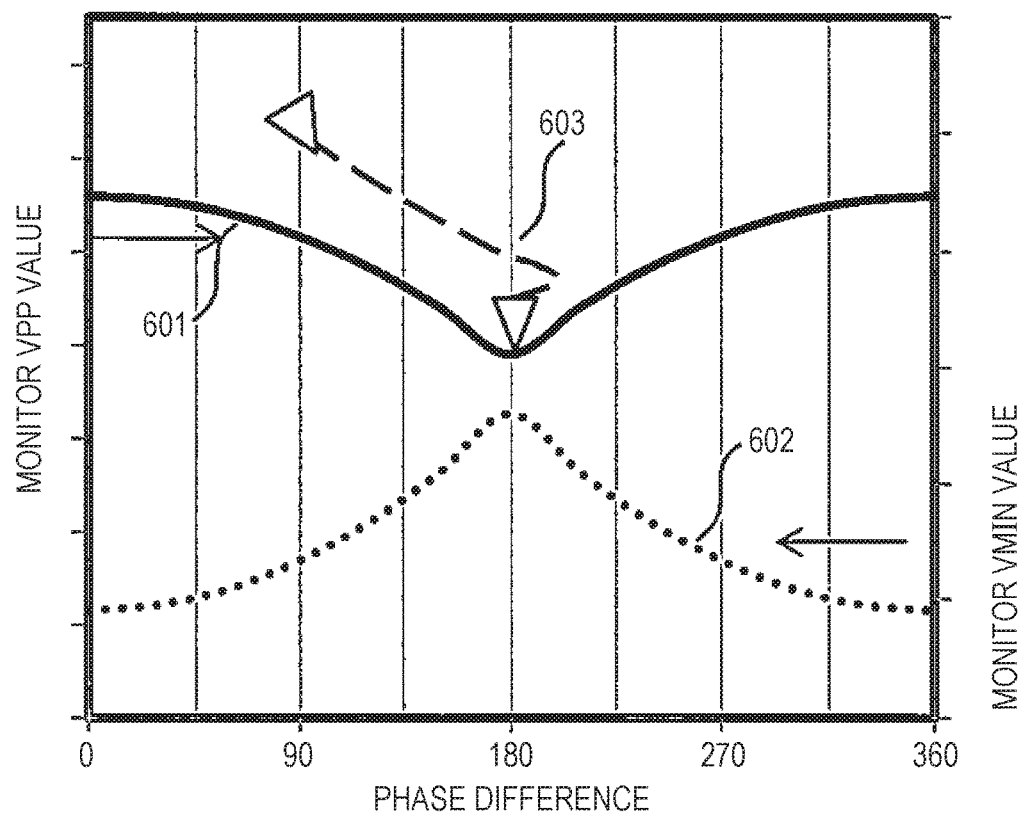
FIG. 6 is a diagram illustrating phase difference dependence of two radio frequency biases with respect to Vpp and VMIN of a voltage on which two radio frequency biases are superimposed.

Therefore, as illustrated in FIG. 5, a phase difference of a phase shifter is set to zero, and a characteristic curve line 601 as illustrated in FIG. 6 is obtained by roughly sweeping a phase difference from 0 to 360 degrees (in other words, one cycle) as well as applying two radio frequency biases. Alternatively, the characteristic curve line 601 may be made into a database in advance. Then, Vpp is adjusted to minimize Vpp of a voltage monitor while changing a phase difference (180 degrees) to plus from −90 degrees predicted as indicated by a curve line 603.

Figure 7:
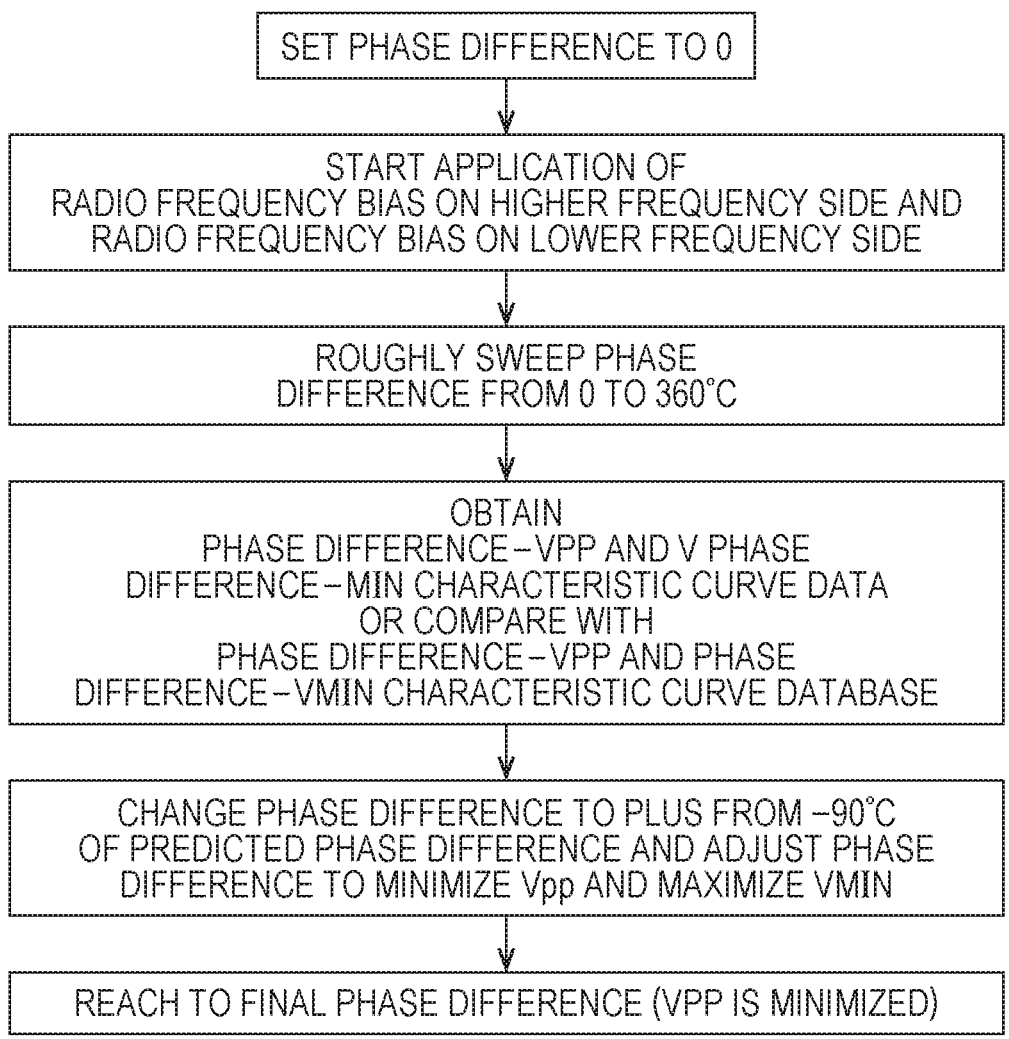
FIG. 7 is a flowchart illustrating a control of a phase difference of two radio frequency biases.

FIG. 7 indicates a method for setting a phase difference between radio frequency biases on a higher frequency side and a lower frequency side in the case where a frequency ratio between the radio frequency biases on a higher frequency side and a lower frequency side is 4. Further, FIG. 8 indicates phase difference dependence with respect to Vpp and VMIN in the case where a frequency ratio between radio frequency biases on a higher frequency side and a lower frequency side is 4. A curve line 801 indicates phase difference dependence with respect to Vpp, and a curve line 802 indicates phase difference dependence with respect to VMIN.

Figure 8:
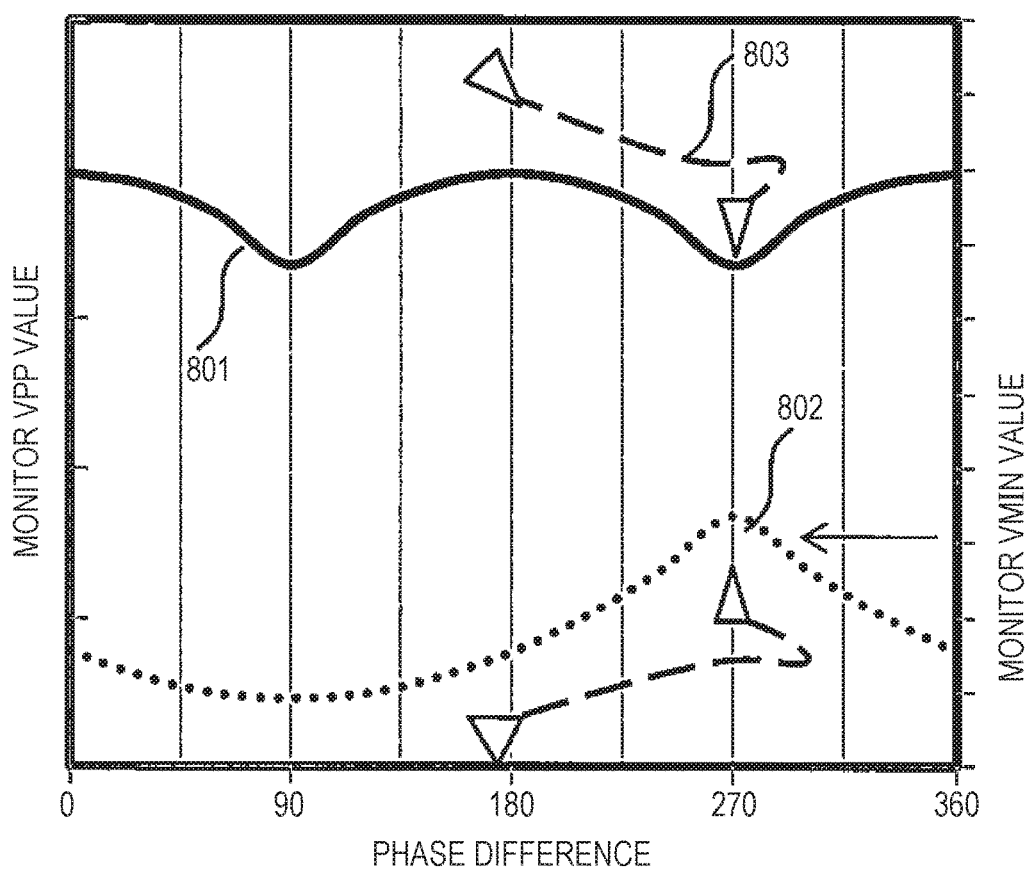
FIG. 8 is a diagram illustrating phase difference dependence of two radio frequency biases with respect to Vpp and VMIN of a voltage on which two radio frequency biases are superimposed.

As illustrated in FIG. 7, a phase difference of a phase shifter is set to zero, and a characteristic curve line 801 as illustrated in FIG. 8 is obtained by roughly sweeping a phase difference from 0 to 360 degrees (in other words, one cycle) as well as applying two radio frequency biases. Alternatively, the characteristic curve line 801 may be made into a database in advance. Then, Vpp is adjusted to minimize Vpp and to maximize VMIN, monitored by a voltage monitor while changing a phase difference to plus from a phase difference (180 degrees) predicted as indicated by a curve line 803. Different from FIG. 5, VMIN is considered when Vpp is adjusted because, as illustrated in FIG. 8, two phase differences to minimize Vpp are included. Further, mainly a control to minimize Vpp is performed. As a subordinate control, a control to maximize VMIN may be added.

Figure 9A:
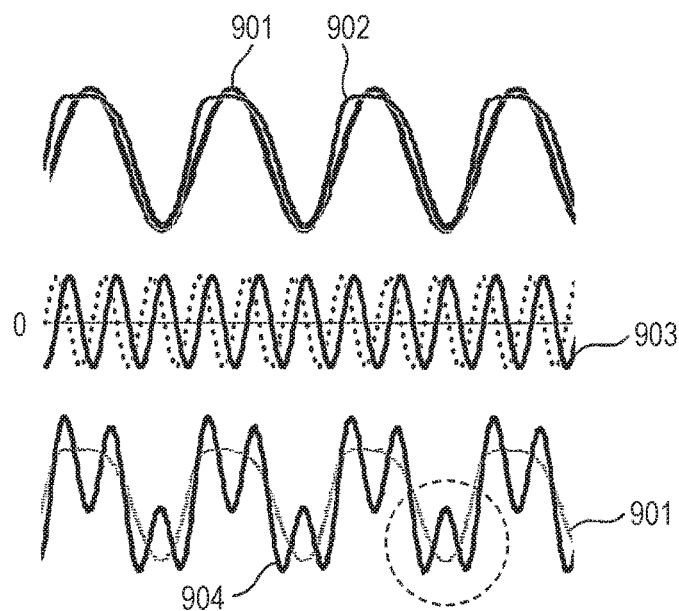
FIGS. 9A to 9C are diagrams illustrating the case where a frequency ratio between radio frequency biases on a lower frequency side and on a higher frequency side is 3.
Figure 9B:
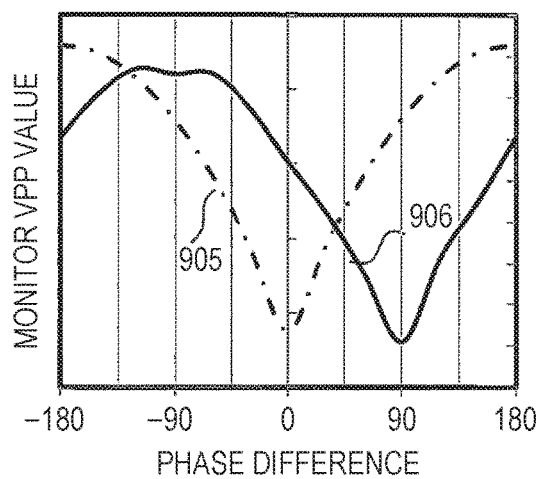
Figure 9C:
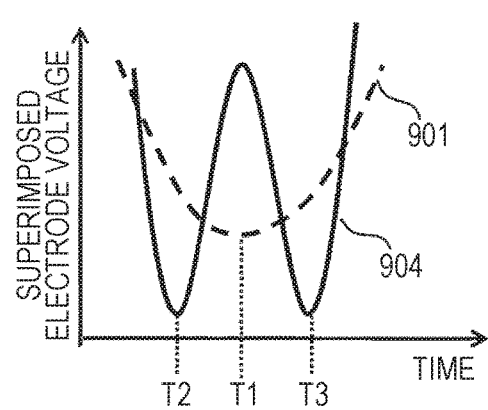

FIGS. 9A to 9C indicate the case where radio frequency biases on a lower frequency side and a higher frequency side are superimposed and applied when plasma is generated, and a frequency ratio between radio frequency biases on a lower frequency side and a higher frequency side is 3. Further, FIG. 9A indicates low-frequency-side radio frequency bias voltages 901 and 902, a higher frequency-side radio frequency bias voltage 903, and a superimposed voltage 904. FIG. 9B indicates a phase difference dependence with respect to Vpp. The voltage waveform 901 is a voltage waveform (sine wave) oscillated from a radio frequency bias on a lower frequency side. The voltage waveform 902 is a radio frequency bias voltage waveform on a lower frequency side when plasma is generated. A curve line 906 indicates phase difference dependence with respect to Vpp when plasma is generated. A curve line 905 indicates phase difference dependence with respect to Vpp when plasma is not generated. Further, FIG. 9C is a view enlarging a portion encircled by a broken line in FIG. 9A.

As illustrated in FIG. 9A, the waveform 902 of a radio frequency bias is distorted by the effects of plasma, a sample stage capacity, and a transmission path, in comparison with the sine waveform 901. The waveform 903 of a radio frequency bias on a higher frequency side also distorts. However, the distortion is small. Further, the waveform 904 monitored by a voltage monitor, on which two radio frequency biases are superimposed, Vpp and control to minimize Vpp are less affected.

As illustrated in FIG. 9B, a phase difference to minimize Vpp in the waveform 905 is 0 degree. On the other hand, a phase difference to minimize Vpp in the waveform 906 which is a characteristic curve line under actual etching conditions is approximately 90 degrees. In this manner, even if a waveform of a radio frequency bias is partially distorted, a phase difference to minimize Vpp can be determined.

In addition, as illustrated in FIG. 9C, a control is important in which a phase difference is determined such that times T2 and T3 at which Vpp is minimized in a radio frequency bias voltage waveform on a higher frequency side 908 come before and after a time T1 at which Vpp is minimized in a radio frequency bias voltage waveform on a lower frequency side 907.

FIGS. 10A and 10B illustrate the case where a frequency ratio between radio frequency biases on a lower frequency side and on a higher frequency side is 4. In addition, FIG. 10A indicates the case where a radio frequency bias waveform on a lower frequency side is a sine wave. FIG. 10B indicates the case where radio frequency biases on a lower frequency side and on a higher frequency side are superimposed and applied during plasma generation.

Waveforms 1001 and 1006 indicate voltage waveforms of a radio frequency bias on a lower frequency side. Waveforms 1002 and 1007 indicate a radio frequency bias voltage waveforms on a higher frequency side. Waveforms 1003 and 1008 indicate voltage waveforms on which radio frequency biases on a lower frequency side and a higher frequency side are superimposed. Waveforms 1004 and 1009 indicate phase difference dependence with respect to Vpp. Waveforms 1005 and 1010 indicate phase difference dependence with respect to VMIN.

A phase difference to minimize Vpp is different in comparison with FIGS. 10A and 10B. Further, the waveform 1004 has two peaks to minimize Vpp. The waveform 1009 has one peak to minimize Vpp. A phase difference to minimize Vpp can be more simply and roughly controlled during plasma generation. In addition, in this case, a control to minimize Vpp is a main control, and also a control to maximize VMIN is also subordinately needed.

Figure 11:
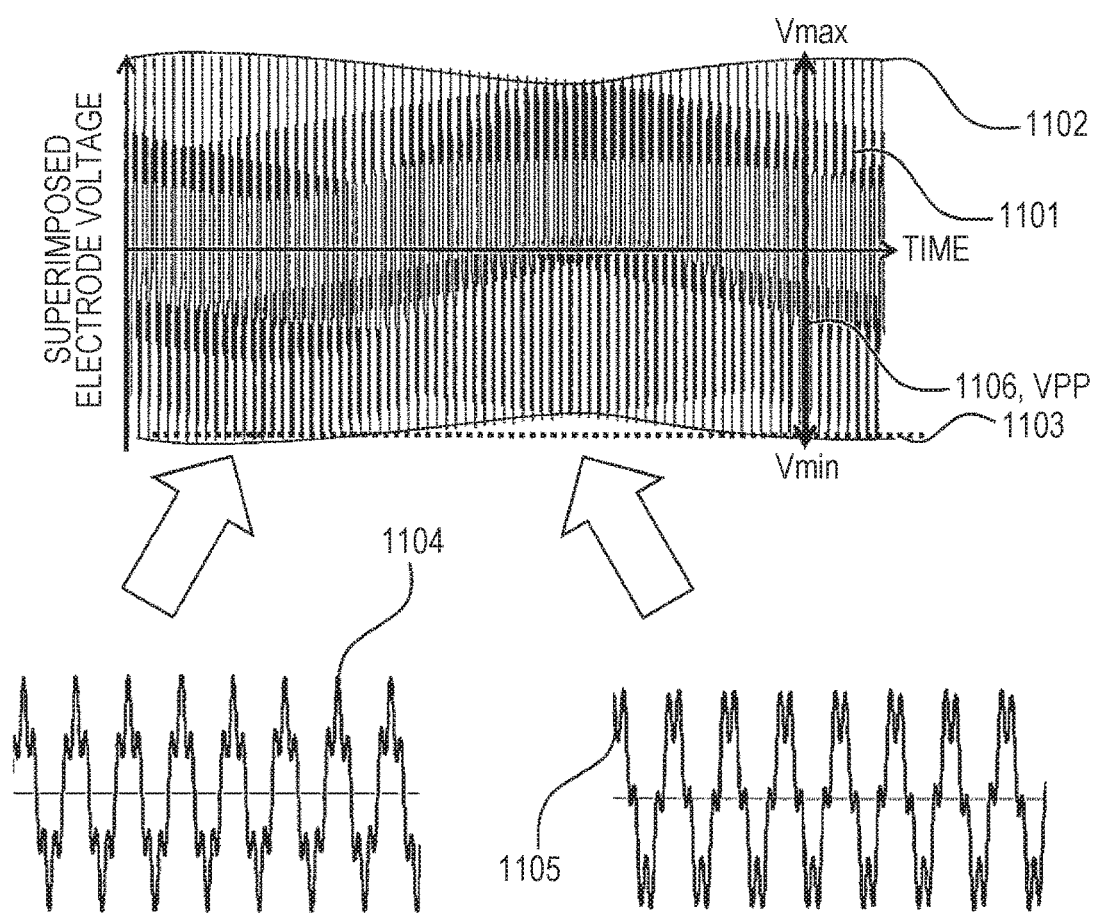
FIG. 11 are diagrams illustrating a phase difference shift in the case where a frequency ratio between radio frequency biases on a higher frequency side and on a lower frequency side is 5.

In the above-described embodiment, the phase shifter 118 controls a phase difference θ to always minimize Vpp. A method to control the phase difference θ as a periodic function which changes with time will be described with reference to FIGS. 11 and 12A to 12G. FIG. 11 indicates a frequency ratio between radio frequency biases on a higher frequency side and on a lower frequency side is 5 and indicates a radio frequency bias voltage waveform 1101 which is superimposed when frequencies of radio frequency biases on a higher frequency side and a lower frequency side are slightly shifted from N integer times. In addition, the case where the frequencies of the radio frequency biases on a higher frequency side and a lower frequency side are slightly shifted from N integer times means the case where the phase difference θ changes with time.

A phase difference changes with time. Therefore, superimposed radio frequency bias voltage waveform changes with time as illustrated in FIG. 11. The waveform 1104 to maximize Vpp and the waveform 1105 to minimize Vpp are periodically repeated. Each of Vpp and VMIN monitored by a voltage monitor is also periodically changed with waveforms 1102 and 1103 with time. If the periodical change is not controlled, a selection ratio in etching processing of the substrate to be processed 109 is changed, and instability and a machine difference may be caused. Therefore, by controlling the phase difference change with time, a selection ratio is controlled with time while maintaining an in-plane distribution of etching.

Figure 12:
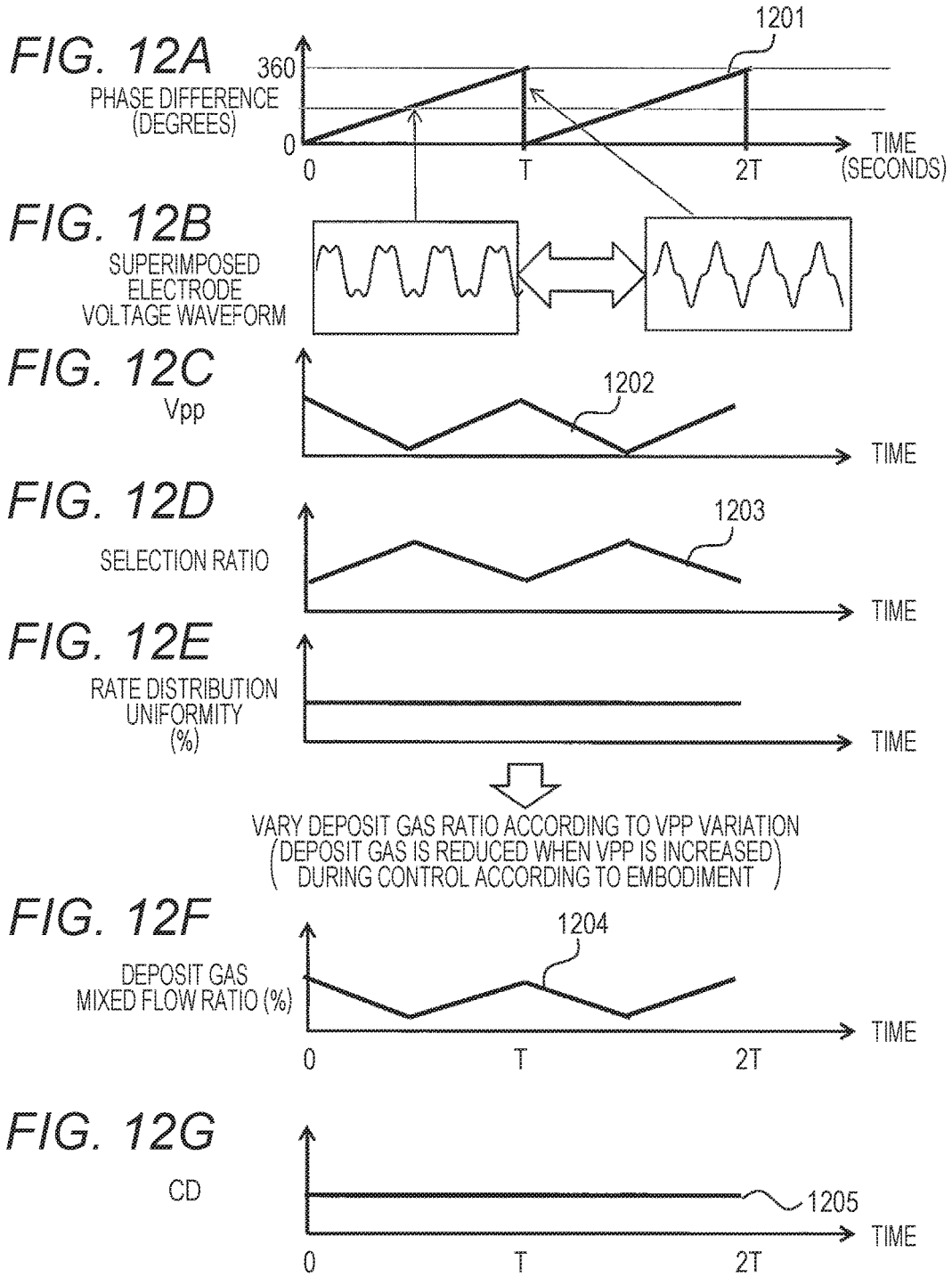
FIGS. 12A to 12G are diagrams illustrating an example in which a phase difference of two radio frequency biases are controlled by time.

As illustrated in FIGS. 12A and 12B, by controlling a phase difference by formula 1 in which a function waveform is a waveform 1201, Vpp of a waveform 1202 illustrated in FIG. 12C and a selection ratio of a waveform 1203 illustrated in FIG. 12D can be controlled at a second order cycle.

$$\theta(t)=2\pi \times t/T(\text{sec}) \qquad \text{(formula 1), T:(cycle)}$$

When a frequency ratio is slightly shifted from N as in the case where a frequency of a radio frequency bias on a lower frequency side is 400 KHz and a frequency of a radio frequency bias on a higher frequency side is 2 MHz+100 Hz, a change cycle of Vpp at this time is 100 Hz. Therefore, in comparison with the case where the change is controlled, it is much easy to control the phase change θ as a periodic function which changes with time.

Further, when an amount and a ratio of deposit gas included in a process gas are changed as indicated by a waveform 1204 in FIG. 12F according to changes in Vpp and a selection ratio, etching processing can be proceeded while correcting the selection ratio or a shoulder drop of a mask while keeping an etching distribution. Therefore, a vertical shape is realized in shape etching while keeping CD as indicated by a waveform 1205 in FIG. 12G A response speed to control a change in a flow rate of an etching process gas and a process pressure is a second order. Etching sufficiently corresponding to a control illustrated in FIGS. 12A to 12G can be realized.

Figure 13:
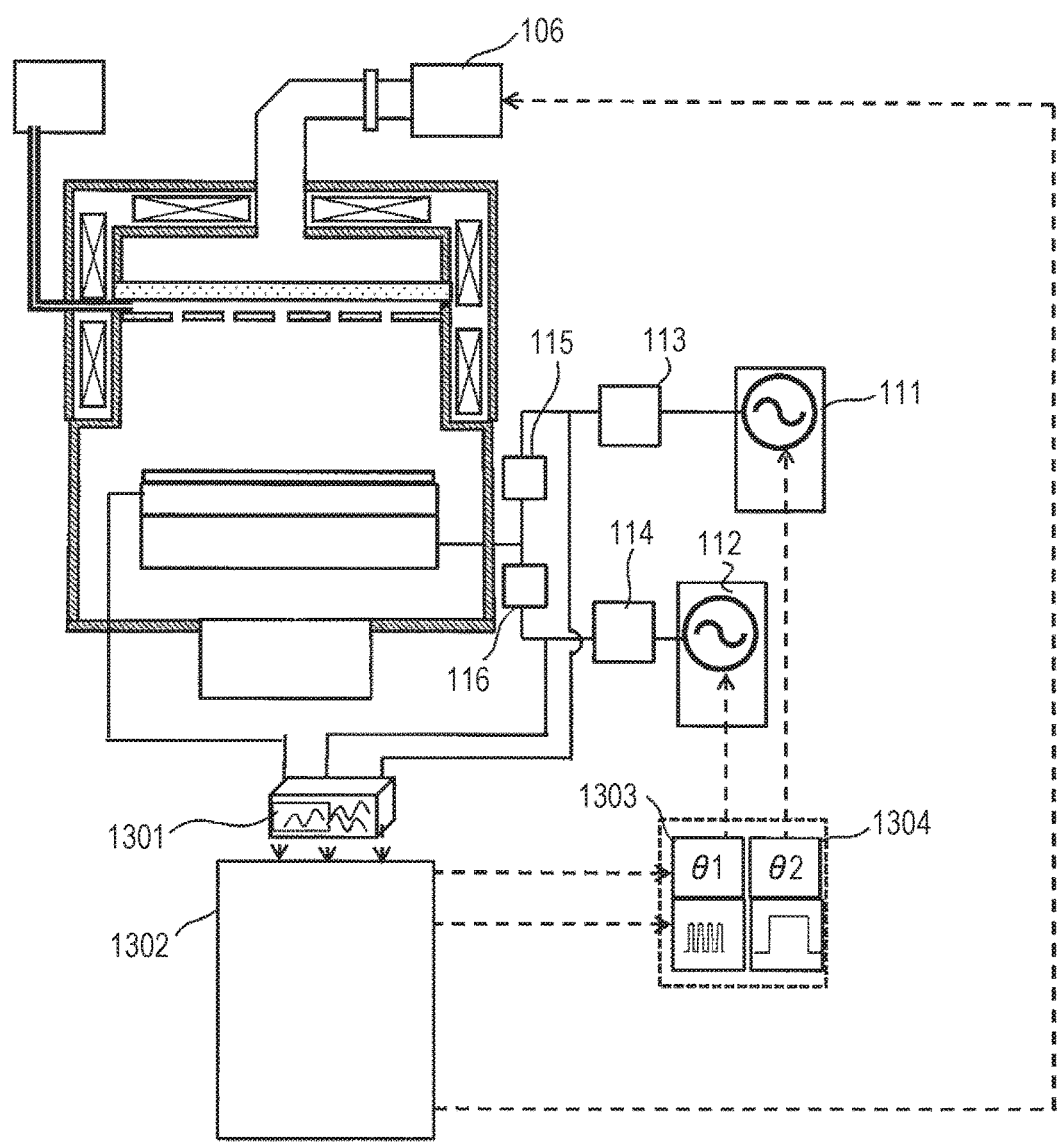
FIG. 13 is a diagram illustrating a voltage monitor 1301 different from a voltage monitor 121 illustrated in FIG. 1.

In the embodiment, the voltage monitor 121 is described as an example for monitoring a voltage of the conductor film 123 in the sample stage 108. A voltage monitor 1301 having other functions will be described with reference to FIG. 13. The voltage monitor 1301 is a system which can monitor a voltage at an outlet of the lower frequency-side matching box 113 and a voltage at an outlet of the higher frequency-side matching box 114 in addition to the voltage of the conductor film 123 in the sample stage 108 and can detect a phase difference at the outlets of the both matching boxes. In FIG. 13, a configuration of reference signs same as in FIG. 1 is same as configuration functions of the same reference signs in FIG. 1. Therefore, descriptions will be omitted.

Further, a plasma processing apparatus illustrated in FIG. 13 includes a lower frequency-side phase sifter 1304 and a higher frequency-side phase shifter 1303. The plasma processing apparatus is a system which controls a phase difference by a controller 1302 based on the effects of a phase shift at oscillation by two frequency-side radio frequency bias power sources, a phase change in each matching box, and especially a delay by a transmission line. For example, in a phase difference control method illustrated in FIG. 5, the system can highly accurately control a phase difference and shorten a time necessary for the phase difference control without obtaining a rough phase difference by roughly sweeping the phase difference and data of such as Vpp characteristics.

As described above, the present invention has been specifically described along the embodiment. However, the present invention is not limited to the embodiment and can be variously changed without departing from the scope of the invention. For example, in a radio frequency bias power source, a frequency ratio on a lower frequency side and a higher frequency side is not necessarily one fixed value. A frequency domain in which a radio frequency bias power source on a higher frequency side can oscillate may be wide. In such case, for example, a frequency ratio can be 1:4 and 1:5 in addition to 1:3. A distribution of an etching rate on a wafer surface can be significantly controlled by a frequency of a radio frequency bias, and therefore controllability of uniformity in the case where two radio frequency biases are superimposed and applied can be improved.

"Minimum Vpp" in "a control of a phase difference to minimize Vpp" in the embodiment is not one minimum point of Vpp and includes values in a predetermined range before and after the minimum Vpp. "Maximum VMIN" in "a control of a phase difference to maximize VMIN" in the embodiment is not one maximum point of VMIN and includes values in a predetermined range before and after the maximum VMIN.

In addition, a material to be processed which becomes a substrate to be processed according to the present invention is not limited to a silicon oxide film. Such as a polysilicon film, a photoresist film, an antireflection film, a silicon nitride oxide film, a silicon nitride film, a Low-k material, A High-k material, an amorphous carbon film, and a silicon substrate can be used. Further, as a process gas according to the present invention, a chlorine gas, a hydrogen bromide gas, a methane tetrafluoride gas, a methane trifluoride gas, a methane bifluoride gas, an argon gas, a helium gas, an oxygen gas, a nitrogen gas, a carbon dioxide gas, a carbon monoxide gas, a hydrogen gas, an ammonia gas, a propane octafluoride gas, a nitrogen trifluoride gas, a sulfur hexafluoride gas, a methane gas, a silicon tetrafluoride gas, and a silicon tetrachloride gas can be used.

In the embodiment, the case where an etching device using a microwave ECR discharge is used is exemplified. In the present invention, a dry etching device can be used which uses UHF discharge with magnetic fields, capacity coupling type discharge, induction coupling type discharge, and magnetron discharge. Further, the present invention is preferably applied in an etching device and processing using a microwave ECR discharge, but is not limited thereto. In a processing device which includes a plurality of radio frequency bias power sources for ion attraction and applies radio frequency biases with two different frequencies, the present invention can be applied in processing to control a selection ratio and a rate distribution by ion energy.

Further, in the embodiment, a phase difference is defined as a phase difference to minimize Vpp. In the present invention, the phase difference may be defined as a phase difference to maximize Vpp, and the phase difference may be defined as a phase difference to maximize an absolute value of Vdc. Vdc is a substantial sinking amount from 0 V of a radio frequency bias voltage.

Figure 17:
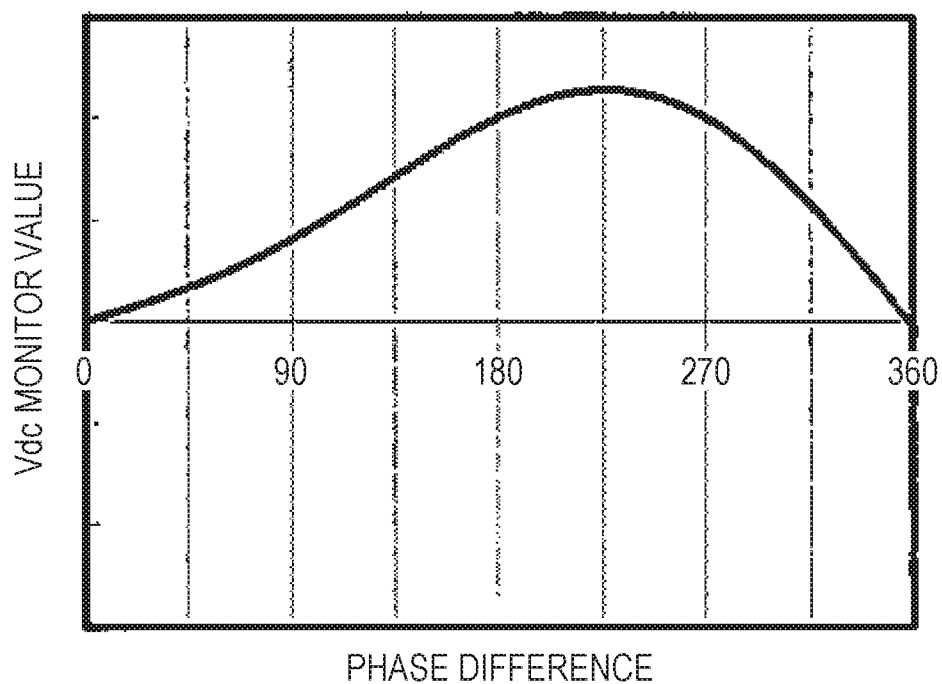
FIG. 17 is a diagram illustrating a characteristic of Vdc with respect to a phase difference.

For example, in the case where a phase difference is set to a phase difference to maximize Vpp, an etching rate can be increased. In addition, in the case where a phase difference is set to a phase difference to maximize an absolute value of Vdc based on characteristics as illustrated in FIG. 17, an average value of ion energy incident to a substrate to be processed is maximized. Therefore, a passing-through property in hole processing can be improved. Specifically, in the present invention, the phase difference is controlled such that a phase difference between a phase of a lower frequency-side radio frequency bias and a phase of a higher frequency-side radio frequency bias becomes a predetermined difference.

What is claimed is:

1. A plasma processing apparatus, comprising:
a processing chamber in which a sample is processed by using a plasma;
a first radio frequency power source supplying a radio frequency power to generate the plasma;
a sample stage on which the sample is placed;
a second radio frequency power source applying a first radio frequency voltage to the sample stage;
a third radio frequency power source applying, to the sample stage, a second radio frequency voltage having a frequency which is N times a frequency of the first radio frequency voltage in a case where N is a natural number of 2 or more;
a phase controller comprising at least one variable phase shifter and configured to generate and output a first frequency pulsar control signal to said second radio frequency power source, and a second frequency pulsar control signal to said third radio frequency power source; and
a controller configured to
control the phase controller such that a phase difference between the phase of the first radio frequency voltage and the phase of the second radio frequency voltage reaches a predetermined value, the predetermined value being determined by said controller setting a phase difference of said variable phase shifter to zero followed by sweeping said phase difference from 0 to 360 degrees to obtain a characteristic curve, and selecting said predetermined value from a point on said characteristic curve based on a minimum value of a peak-to-peak voltage of a radio frequency voltage obtained by superimposing the first radio frequency voltage and the second radio frequency voltage; and
adjust a ratio of a frequency of the second radio frequency voltage to a frequency of the first radio frequency voltage such that an etching rate distribution is a desired etching rate distribution,
wherein said at least one variable phase shifter is configured to adjust a phase difference at said second frequency pulsar control signal with respect to said first frequency pulsar control signal in response to a control signal received from a voltage monitor such that a peak-to-peak voltage of a radio frequency voltage-s applied to said sample stage.

2. A plasma processing apparatus, comprising:
a processing chamber in which a sample is processed by using a plasma;
a first radio frequency power source supplying a radio frequency power to generate the plasma;
a sample stage on which the sample is placed;
a second radio frequency power source applying a first radio frequency voltage to the sample stage;
a third radio frequency power source applying, to the sample stage, a second radio frequency voltage; and
a pulse controller configured to generate and output a first frequency pulsar control signal to said second radio frequency power source, and a second frequency pulsar control signal to said third radio frequency power source; and
a controller configured to control a phase controller such that a phase difference between a phase of the first radio frequency voltage and a phase of the second radio frequency voltage reaches a predetermined value, the predetermined value being determined by said controller setting a phase difference of said variable phase shifter to zero followed by sweeping said phase difference from 0 to 360 degrees to obtain a characteristic curve, and selecting said predetermined value from a point on said characteristic curve based on a minimum value of a peak-to-peak voltage of a radio frequency voltage obtained by superimposing the first radio frequency voltage and the second radio frequency voltage.

3. A plasma processing apparatus, comprising:
a processing chamber in which a sample is processed by using a plasma;
a first radio frequency power source supplying a radio frequency power to generate the plasma;
a sample stage on which the sample is placed;
a second radio frequency power source applying a first radio frequency voltage to the sample stage;
a third radio frequency power source applying, to the sample stage, a second radio frequency voltage having a frequency which is N times a frequency of the first radio frequency voltage in a case where N is a natural number of 2 or more;
a phase controller comprising at least one variable phase shifter and configured to generate and output a first frequency pulsar control signal to said second radio frequency power source, and a second frequency pulsar control signal to said third radio frequency power source;
a voltage monitor detecting a minimum value of a peak-to-peak voltage of a radio frequency voltage obtained by superimposing the first radio frequency voltage and the second radio frequency voltage; and
a controller configured to control the phase controller such that a phase difference between a phase of the first radio frequency voltage and a phase of the second radio frequency voltage reaches a value determined by setting a phase difference of said variable phase shifter to zero followed by sweeping said phase difference from 0 to 360 degrees to obtain a characteristic curve, and selecting said predetermined value from a point on said characteristic curve based on the minimum value of the peak-to-peak voltage detected by the monitor,
wherein said at least one variable phase shifter is configured to adjust a phase difference at said second frequency pulsar control signal with respect to said first frequency pulsar control signal in response to a control signal received from the voltage monitor such that a peak-to-peak voltage of a radio frequency voltage applied to said sample stage is a minimum value.

4. The plasma processing apparatus according to claim 3, wherein the controller is further configured to adjust a ratio of a frequency of the second radio frequency voltage to a frequency of the first radio frequency voltage such that an etching rate distribution is a desired etching rate distribution.

* * * * *